US010563300B2

(12) United States Patent
Teo et al.

(10) Patent No.: US 10,563,300 B2
(45) Date of Patent: Feb. 18, 2020

(54) METHOD FOR SEPARATING A CARBON STRUCTURE FROM A SEED STRUCTURE

(71) Applicant: AIXTRON SE, Herzogenrath (DE)

(72) Inventors: Kenneth B. K. Teo, Cambridgeshire (GB); Alexandre Jouvray, Cambridgeshire (GB); Jai Matharu, Hertfordshire (GB); Simon Thomas, Cambridgeshire (GB)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 15/522,021

(22) PCT Filed: Oct. 12, 2015

(86) PCT No.: PCT/EP2015/073553
§ 371 (c)(1),
(2) Date: Apr. 26, 2017

(87) PCT Pub. No.: WO2016/066413
PCT Pub. Date: May 6, 2016

(65) Prior Publication Data
US 2017/0314122 A1 Nov. 2, 2017

(30) Foreign Application Priority Data
Oct. 29, 2014 (DE) .................. 10 2014 115 708

(51) Int. Cl.
C23F 1/00 (2006.01)
C23F 1/02 (2006.01)
(Continued)

(52) U.S. Cl.
CPC .............. C23C 16/01 (2013.01); C01B 32/16 (2017.08); C01B 32/168 (2017.08); C01B 32/18 (2017.08);
(Continued)

(58) Field of Classification Search
CPC ....... C23C 16/01; C23C 16/26; C01B 32/168; C01B 32/194; C23F 1/00; C23F 1/02
See application file for complete search history.

(56) References Cited

U.S. PATENT DOCUMENTS 8,685,843 B2   4/2014  Li et al.
8,728,433 B2   5/2014  Sutter et al.
(Continued)

FOREIGN PATENT DOCUMENTS

DE   102011056538 A1   6/2013
JP       S6479384 A    3/1989
(Continued)

OTHER PUBLICATIONS

International Search Report dated Dec. 11, 2015, from the European Patent Office, for International Patent Application No. PCT/EP2015/073553 (filed Oct. 12, 2015), 9 pages.
(Continued)

Primary Examiner — Thomas T Pham
(74) Attorney, Agent, or Firm — Ascenda Law Group, PC

(57) ABSTRACT

A method is employed to separate a carbon structure, which is disposed on a seed structure, from the seed structure. In the method, a carbon structure is deposited on the seed structure in a process chamber of a CVD reactor. The substrate comprising the seed structure (2) and the carbon structure (1) is heated to a process temperature. At least one etching gas is injected into the process chamber, the etching gas having the chemical formula $AO_mX_n$, $AO_mX_nY_p$ or $A_mX_n$, wherein A is selected from a group of elements that includes S, C and N, wherein O is oxygen, wherein X and Y are different halogens, and wherein m, n and p are natural numbers greater than zero. Through a chemical reaction with the etching gas, the seed structure is converted into a gaseous reaction product. A carrier gas flow is used to
(Continued)

remove the gaseous reaction product from the process chamber.

15 Claims, 4 Drawing Sheets

(51) Int. Cl.
| | |
|---|---|
| C23C 16/01 | (2006.01) |
| C01B 32/16 | (2017.01) |
| C01B 32/168 | (2017.01) |
| C01B 32/186 | (2017.01) |
| C01B 32/194 | (2017.01) |
| C23C 16/26 | (2006.01) |
| C01B 32/18 | (2017.01) |
| C23C 16/46 | (2006.01) |
| C23C 16/48 | (2006.01) |
| C23C 16/50 | (2006.01) |
| B82Y 30/00 | (2011.01) |
| B82Y 40/00 | (2011.01) |

(52) U.S. Cl.
CPC .......... *C01B 32/186* (2017.08); *C01B 32/194* (2017.08); *C23C 16/26* (2013.01); *C23C 16/46* (2013.01); *C23C 16/48* (2013.01); *C23C 16/50* (2013.01); *B82Y 30/00* (2013.01); *B82Y 40/00* (2013.01); *Y10S 977/734* (2013.01); *Y10S 977/742* (2013.01); *Y10S 977/762* (2013.01); *Y10S 977/843* (2013.01)

(56) References Cited

U.S. PATENT DOCUMENTS

| | | | |
|---|---|---|---|
| 9,371,234 B2* | 6/2016 | Hong | C23C 16/26 |
| 2005/0009350 A1* | 1/2005 | Vogt | H01L 21/0332 |
| | | | 438/689 |
| 2011/0237051 A1 | 9/2011 | Hess et al. | |
| 2014/0147353 A1* | 5/2014 | Lin | C22B 3/0005 |
| | | | 423/22 |
| 2015/0011027 A1* | 1/2015 | Lian | H01L 22/12 |
| | | | 438/16 |
| 2015/0218695 A1* | 8/2015 | Odedra | C23G 5/00 |
| | | | 134/1.1 |
| 2016/0189821 A1* | 6/2016 | Yoon | B82Y 30/00 |
| | | | 156/238 |

FOREIGN PATENT DOCUMENTS

| | | |
|---|---|---|
| WO | 2012/039533 A1 | 3/2012 |
| WO | 2014/094103 A1 | 6/2014 |

OTHER PUBLICATIONS

Teo; et al., "Catalytic Synthesis of Carbon Nanotubes and Nanofibers", Encyclopedia of Nanoscience and Nanotechnology (2003), X:1-22.
Written Opinion dated Dec. 11, 2015, from the European Patent Office, for International Patent Application No. PCT/EP2015/073553 (filed Oct. 12, 2015), 8 pages.
Aixtron SE, PCT/EP2015/073553 filed Oct. 12, 2015; International Preliminary Report on Patentability, English Translation, dated May 2, 2017, 12 pages.
Aixtron SE, PCT/EP2015/073553 filed Oct. 12, 2015; International Preliminary Report on Patentability, dated May 2, 2017, 9 pages.
Aixtron SE, PCT/EP2015/073553 filed Oct. 12, 2015; EnglishTranslation of Written Opinion, dated Dec. 11, 2015, 11 pages.

* cited by examiner

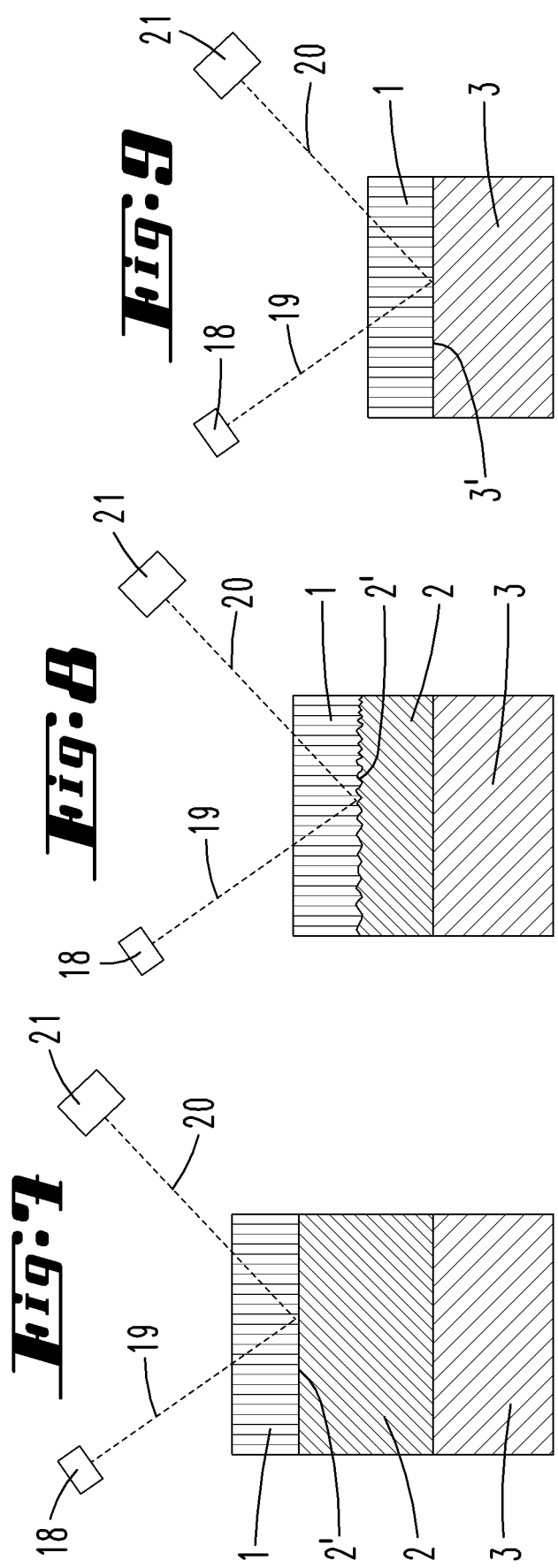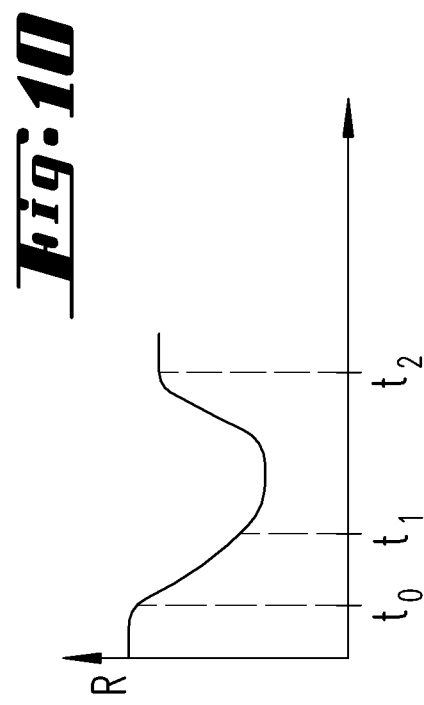

METHOD FOR SEPARATING A CARBON STRUCTURE FROM A SEED STRUCTURE

RELATED APPLICATIONS

This application is a National Stage under 35 USC 371 of and claims priority to International Application No. PCT/EP2015/073553, filed 12 Oct. 2015, which claims the priority benefit of DE Application No. 10 2014 115 708.7, filed 29 Oct. 2014.

FIELD OF THE INVENTION

The invention relates to a method for separating a carbon structure deposited on a seed structure, for example graphene, carbon nanotubes or semiconductor nanowires, from the seed structure.

BACKGROUND

It is known from the prior art to deposit carbon structures, for example graphene layers, carbon nanotubes and semiconductor nanowires, on substrates. U.S. Pat. No. 8,685,843 B2, among others, describes such a method. The deposition of the carbon structures thereby takes place on a seed structure, for example a metal structure, which can be a metal layer, in particular copper layer. The deposition of graphene is also described in U.S. Pat. No. 8,728,433 B2. After the deposition of the graphene layer, of the carbon nanotubes or of the semiconductor nanowires on the seed structure, it is necessary to release the structures or layers, respectively, from one another. In the prior art, this takes place by means of a wet etching method, in the case of which the seed structure is etched away in an aqueous solution.

Methods for cleaning a process chamber of a CVD reactor in the dry etching method are furthermore known. For example, WO 2014/094103 A1 shows a cleaning method for removing III-V coatings on the walls of a reactor by introducing thionyl chloride into the process chamber.

SUMMARY OF THE INVENTION

The invention is based on the object of simplifying the production of carbon structures and to in particular specify a method, by means of which the separation of the carbon structure from the seed structure is possible within the process chamber, in which the deposition takes place.

The object is solved by means of the invention specified in the claims, wherein, on principle, every claim is an independent solution of the object. The method substantially consists of the following steps:

- providing a carbon structure deposited on a seed structure in a process chamber of a CVD reactors;
- heating the substrate comprising the seed structure (2) and the carbon structure (1) to a process temperature;
- injecting at least one etching gas with the molecular formula $AO_mX_n$, $AO_mX_nY_p$ or $A_mX_n$,
  - wherein A is selected from a group of elements, which includes S, C, N,
  - wherein O is oxygen,
  - wherein X, Y are different halogens and
  - m, n, p are natural numbers >zero;
- converting the seed structure through a chemical reaction with the etching gas into a gaseous reaction product;
- removing the gaseous reaction product from the process chamber by means of a carrier gas flow.

The method steps are preferably carried out immediately after the method steps of a coating method, in the case of which a carbon structure was applied to or underneath a seed structure, as is described in the above-mentioned prior art. The catalytic synthesis of "carbon nanotubes" and "carbon nanofibers", which precedes the separating method according to the invention, is described under the title "Catalytic Synthesis of Carbon Nanotubes and Nanofibers" in the Encyclopedia of Nanoscience and Nanotechnology, Volume X: Pages 1-22, by Kenneth B. K. Teo, Charanjeet Singh, Manish Chhowalla and William I. Milne. The content of this paper belongs to the disclosure content of this patent application. The separation of the carbon structure from the seed structure preferably takes place in the same process chamber, in which the deposition process also took place and without the object, which has the carbon structure, having been removed from the process chamber. The object carrying the carbon structure can be a substrate, for example a dielectric substrate, which is provided with a seed structure. The seed structure can consist of Cu, Ni, Co, Fe, Ru, Ir, Ga, Gd, Mo, Mn, Ag, Au, B, Si or Ge or of a metal, but also of a material containing a plurality of the above-mentioned elements. The seed structure can be particles or a structured or unstructured layer on a substrate. Provision is in particular made for the seed structure to be arranged between the substrate and carbon structure. Such an object consisting of substrate, seed structure and carbon structure, includes a carbon structure, which was deposited on the seed structure. The object can also only be a carbon structure, which is deposited on a seed structure. In this case, the seed structure forms the substrate itself. The seed structure forms a catalytic element, on which the nanostructures, thus nanotubes or nanowires, grow. These catalytic structures can also be formed by particles, which are carried by the substrate. The carbon structures then grow between the substrate and the particles. According to the invention, the seed structure is brought into the gaseous form by introducing an etching gas into the process chamber at elevated temperature. As a result of the etching process, the carbon structure bears substantially loosely either on the substrate or on a susceptor. The etching gas can be activated. The activation of the etching gas can take place by an energy supply. A heat source, in particular a heater or a UV lamp or a plasma generator, can serve as energy source. Particularly preferably, the activation takes place within the process chamber by using heat generated there, for example in that the etching gas comes into contact with heated walls of the process chamber or comes into contact with a heated gas within the process chamber. The activation, which in particular takes place by means of heating, can take place in a gas inlet body or within the process chamber itself. However, it is also possible that the etching gas is activated by heat emitted by a heated susceptor, whereby the objects bear on the susceptor. Provision can further be made for the etching gas to consist of two gases, which differ from one another. The etching gas is preferably kept ready or is generated in a gas source. The gas source can be a liquid tank, through which a carrier gas, for example Ar, $N_2$ or $H_2$, flows. The etching gas in particular consists of $SOCl_2$ $SOBr_2$, $COCl_2$, $NOCl$, $NOBr$, $SOBr$. Particularly preferably, thionyl chloride $SOCl_2$ is used as an etching gas. In particular a liquid, which was brought into the gaseous form, and which has a carbonyl, a thionyl or a nitrosyl group and a halogen, for example a chloride, a bromide or iodite, is used as an etching gas. The method according to the invention is carried out in a device, which has a reactor housing, which is sealed against the outside in a gas-tight manner. The reactor housing can be evacuated by means of a pump. A gas inlet body comprising at least one, but preferably a plurality of gas outlet openings, is located in the reactor housing. A susceptor, which can consist of metal or graphite and which can be heated to a process temperature of between 100° C. and at least 1000° C. by means of a heater, is further located within the process chamber. Substrates, which are treated in a coating process in such a way that seed structures are also deposited on carbon structures, for example graphene, nanotubes or semiconductor nanowires, are located on the susceptor. After the deposition process, the process chamber is flushed with an inert gas. The process chamber is subsequently brought to a reaction temperature, which corresponds to a process temperature, at which the etching gas chemically reacts with the seed layer. This temperature can be at least 800° C. As soon as the object, which has the carbon structure and which is located on the substrate, has reached the process temperature, the etching gas, in particular thionyl chloride, is introduced into the process chamber. At 900 mbar of total pressure, for example, 120 mmol per minute can be introduced into the process chamber. The etching gas is introduced into the process chamber by means of a carrier gas and heats up there, so that it is activated. In response to this activation, the etching gas can pre-decompose into first reaction products. Seed structure and the carbon structure are separated from one another by means of the etching gas or by means of the pre-decomposition products resulting therefrom, respectively. The etching process typically lasts 5 minutes. After this, the supply of the etching gas is stopped and only an inert gas is introduced into the process chamber, which is cooled down for the removal of the carbon structures. After completion of the etching step, the removal of reaction products or of the etching gas, respectively, can also take place by pumping out the process chamber at a vacuum pressure. In addition to the above-described etching gas, an additive gas, which is a chemical bond between hydrogen or metal and a halogen, can also be introduced into the process chamber. In an alternative of the invention, the process chamber has detector means, by means of which the progress of the conversion of the seed structure into a gaseous reaction product can be observed continuously. This may be a light source, which emits continuous or pulsed light, for example a light beam. The light beam hits the object, is reflected by the object. The reflected light beam hits a detector. The detector measures in particular the intensity of the light beam. The level of reflection or the reflection capacity, respectively, the reflectivity or reflectance of the object is thus determined. In particular the time change of the reflectivity is determined by means of the detector arrangement. The light beam preferably penetrates the carbon structure and is reflected on the surface of the seed structure, thus effectively at the boundary layer of the carbon structure to the seed structure. The reflection capacity of the surface, which changes in the course of the etching process, is thus determined. At the beginning of the etching process, the surface can be a smooth metal layer comprising a correspondingly high reflection capacity. During the etching process, the seed structure is etched away on the surface, so that the surface becomes rougher. The reflection capacity of the surface drops to a minimum in order to increase again shortly prior to the complete removal of the seed structure. After removal of the seed structure, the light beam is reflected on the smooth surface of the substrate, which has a high reflection capacity and which is not attacked by the etching gas. The etching gas does not react with the substrate. The detection of this increase of the reflection capacity after passing through a minimum can be used to turn off the etching gas supply. An automatic turn-off of the etching gas injection occurs in particular when the reflection capacity after passing through a minimum has reached a maximum again.

The invention furthermore relates to a device for carrying out the method, which is characterized in that a source for the etching gas is provided. In addition, the device can have optical detection means for determining the progress of the separating process, which cooperate with a control device in order to turn off the supply of the etching gas.

BRIEF DESCRIPTION OF THE DRAWINGS

Exemplary embodiments of the invention will be explained below by means of enclosed drawings.

FIG. 7 shows an illustration according to FIG. 6 prior to the introduction of the etching gas at the time $t_0$;

FIG. 8 shows a follow-up illustration for FIG. 7 during the etching process at the time $t_1$;

FIG. 9 shows a follow-up illustration for FIG. 8 at the time $t_2$ and

FIG. 10 shows the chronological sequence of the reflectivity of the boundary surface 2' of the seed structure 2 to the carbon structure 1 during the etching process, only qualitatively.

DETAILED DESCRIPTION

Figure 1:
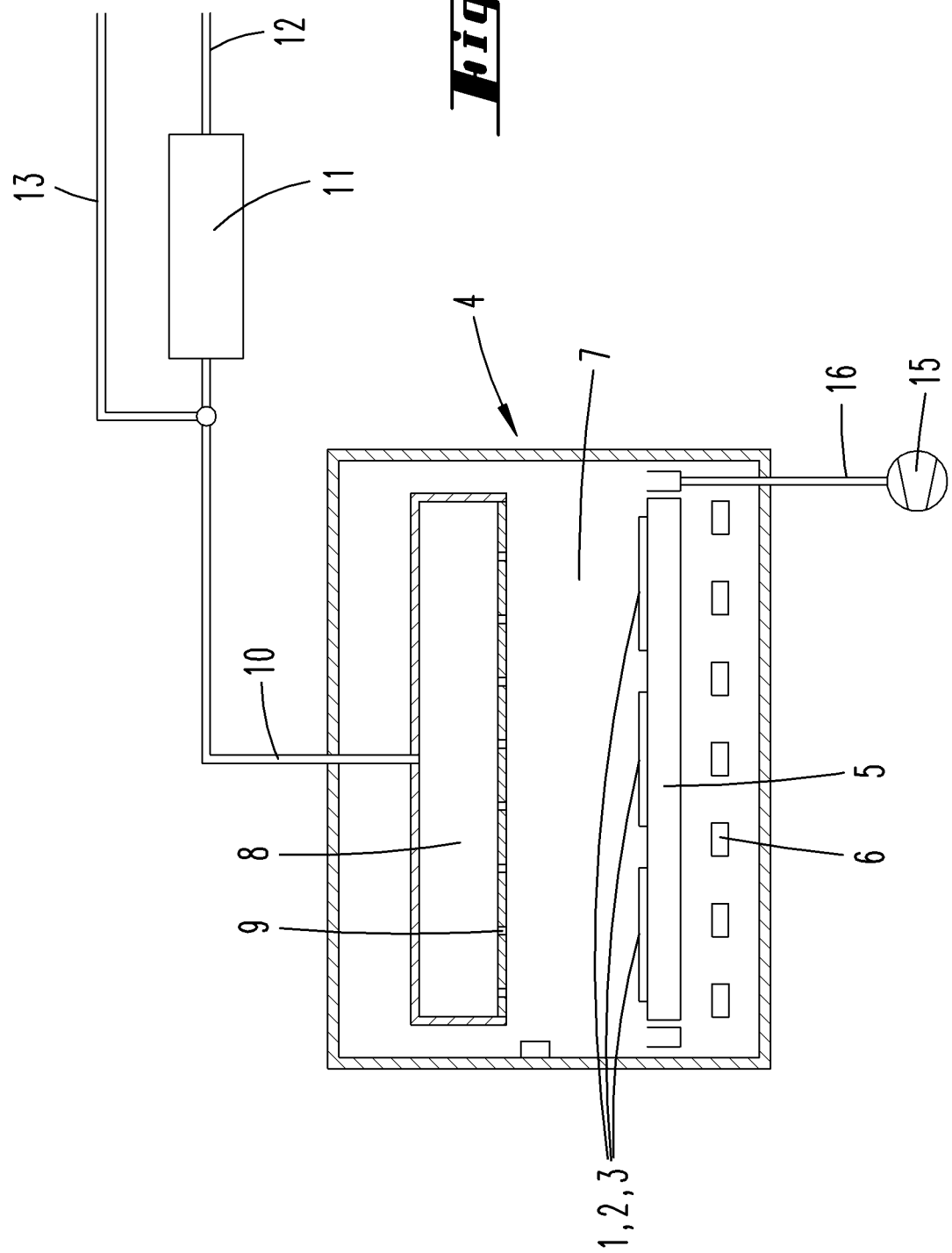
FIG. 1 shows a CVD reactor arrangement of a first exemplary embodiment in a schematic view.
Figure 2:
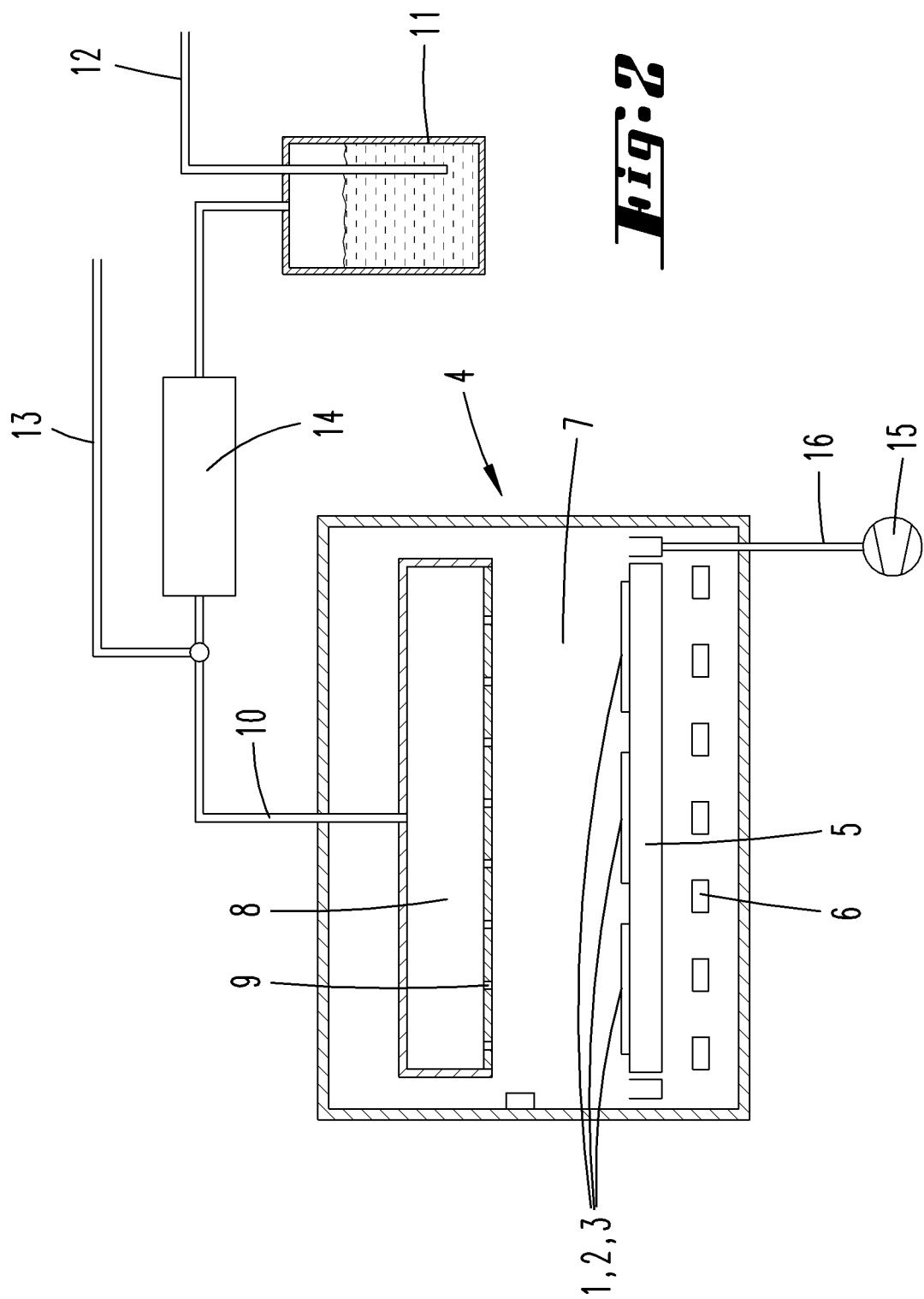
FIG. 2 shows a CVD reactor arrangement of a second exemplary embodiment in a schematic view.

The CVD reactor 4 illustrated in FIGS. 1 and 2 consists of a housing, which is gas-tight to the outside. A susceptor 5 of graphite, quartz or a metal for accommodating objects 2, 3, on which a carbon structure 1 is deposited, is located inside the housing. A heater 6 is located underneath the susceptor 5. It can be a resistance heater, an IR heater or an RF heater. The circular disk-shaped susceptor 5 is surrounded by a gas outlet body, which is connected to a pump 15 by means by gas drain 16. A process chamber 7 is located above the susceptor 5. The ceiling of the process chamber 7 is formed by a gas exit surface of a gas inlet body 8. The gas inlet body 8 can be a shower head-shaped hollow body, which has a plurality of gas exit openings 9 on its underside. A process gas can be injected into the gas inlet body 8 by means of a supply line 10.

To carry out the method for depositing the carbon structures 1, thus for example a graphene layer, a graphene layer consisting of a plurality of layers, of carbon nanotubes or of semiconductor nanowires, a suitable process gas, which includes carbon, for example methane, is injected into the process chamber 7 through the supply line 10. The objects, which bear on the susceptor 5 therein, have a seed structure, for example a seed layer or a structured seed layer 2, which consists of copper. The mentioned carbon nanostructures 1 form on this seed structure 2. The objects can have substrates 3, which are coated with a seed structure 2. The seed structure 2 can have a smooth surface. It is also possible, however, that catalytically acting particles, which form the seed structure 2, bear on the substrates 3. The particles have a diameter, which lies in the nanometer range. In response to the deposition of the nanostructures, nanotubes or nanowires form between substrate and particle. The particles can be spaced apart from one another.

An etching gas is used to separate the carbon nanostructures 1 from the seed structures 2. This etching gas is generated in an etching gas source 11. The etching gas is guided through the supply line 10 into the gas inlet body 8 by means of a carrier gas, which is an inert gas from Ar, $N_2$ or $H_2$, which is injected into a supply line 12. In the supply line 10, a further inert gas, for example Ar, $N_2$ or $H_2$, is additionally injected into the supply line 10 by means of the supply line 13.

In the case of the exemplary embodiment illustrated in FIG. 1, the etching gas 11 is activated by heating within the process chamber 7 or within the gas inlet body 8, respectively. The etching gas source 11 can be a bubbler as it is illustrated in FIG. 2.

The bubbler illustrated in FIG. 2 is a container in which a liquid starting material is stored. The starting material can be $SOCl_2$, $SOBr_2$, $COCl_2$, $NOCl_2$, $NOBr_2$ or SOBr. Preferably, the liquid is thionyl chloride. An etching gas is generated by guiding an inert gas through the liquid.

In the exemplary embodiment illustrated in FIG. 2, provision is made for an external activator 14, in which the etching gas is activated. This can take place by adding heat to the etching gas, by UV or by a plasma. A heat source, a UV source or a plasma generator can thus be arranged in the activator 14.

A pre-decomposition of the etching gas can take place in response to the activation of the etching gas.

To carry out the etching process, the susceptor 5 is heated to a temperature of approximately 800° C. The etching gas or the pre-decomposed etching gas reacts with the seed structure 2 and converts the latter into a volatile starting material, which is removed from the drain 16 from the process chamber 7 together with the carrier gas.

Figure 3:
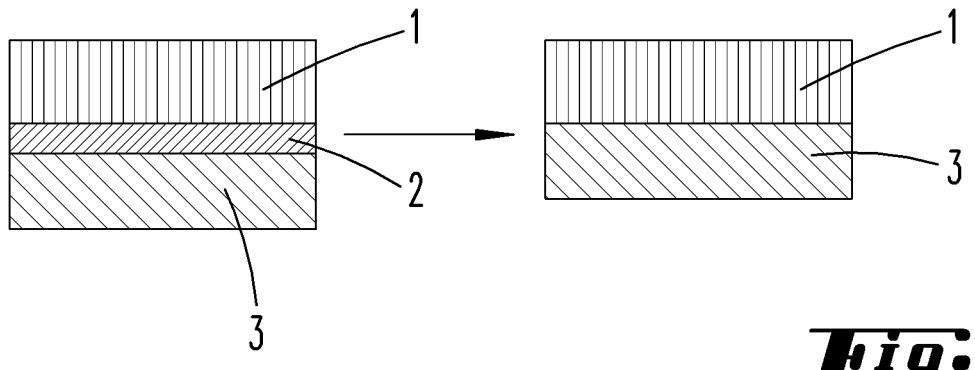
FIG. 3 shows a first exemplary embodiment of the separating method in a schematic view.

The exemplary embodiment illustrated in FIG. 3 shows an object consisting of a substrate 3, which can be a dielectric body and which consists of a seed structure 2 applied thereto. The seed structure 2 can consist of copper and can be a layer comprising a smooth surface. A graphene layer 1 is deposited on the seed structure 2. It can be a mono-layer of graphene. A few graphene layers can also be deposited on top of one another. In response to the above-described etching process, the etching gas or first reaction products of the etching gas penetrates the graphene layer 1 and converts the seed structure 2 into a gaseous second reaction product, so that the result illustrated on the right in FIG. 3 is created, in the case of which the graphene layer 1 bears directly on the substrate 3.

Figure 4:
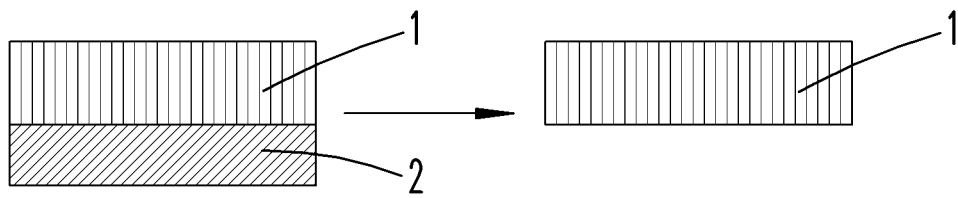
FIG. 4 shows a second exemplary embodiment of the separating method.

On the left, FIG. 4 shows a graphene layer 1, which was deposited on a seed structure 2, which is a copper plate. The copper plate 2 is removed by means of the etching process, so that—as is illustrated on the right in FIG. 4—only graphene 1 remains.

Figure 5:
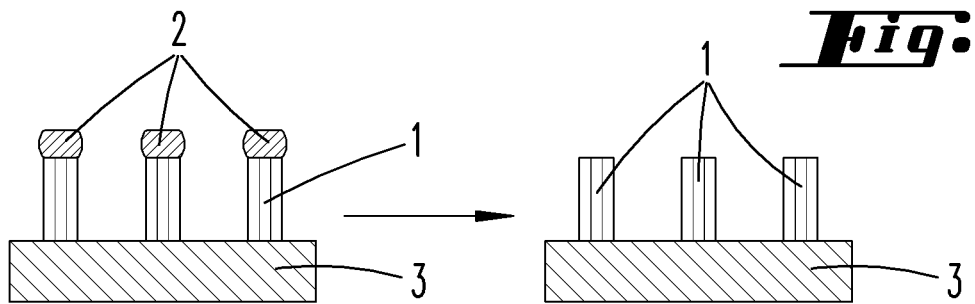
FIG. 5 shows a third exemplary embodiment of the separating method.

In the case of the exemplary embodiment illustrated in FIG. 5, the carbon structure 1, for example in the form of nanowires or nanotubes, grows underneath a seed structure 2 of copper, which consists of particles bearing on the surface of the substrate 3. To deposit such carbon structures 1, copper particles or particles of another suitable catalytically acting material, are applied to a substrate 3. The carbon structures 1 then grow between substrate 3 and the particles. A corresponding structure is illustrated schematically on the left in FIG. 5. After the etching process, the seed structure 2 is removed, so that—as is illustrated on the right in FIG. 5—the nanotubes 1 or nanowires, respectively, bear directly on the substrate 3.

Figure 6:
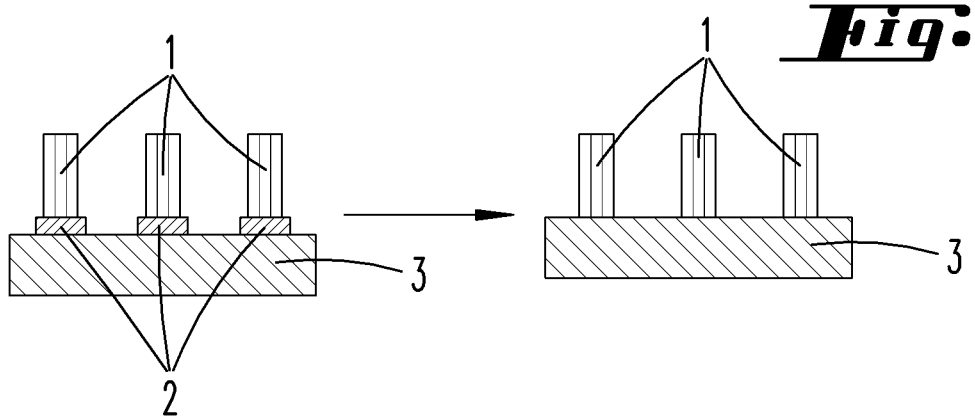
FIG. 6 shows a fourth exemplary embodiment of the separating method.

In the case of the exemplary embodiment illustrated in FIG. 6, an object, in the case of which a substrate 3 has a laterally structured seed structure 2, is illustrated on the left. Nanotubes 1 are deposited on this seed structure 2. The state illustrated on the right in FIG. 6, in the case of which the nanotubes 1 bear directly on the substrate 3, is attained by means of the above-described etching process, in the case of which the seed structure 2 is removed by means of a dry etching method.

The deposition process as well as the separating process, which takes place by introducing an etching gas, can be carried out in the device illustrated in FIGS. 1 and 2.

FIGS. 7 to 9 show a cross section through an object consisting of a substrate 3, to which a metallic seed structure 2 comprising a smooth surface 2' is applied, in a schematic view. A carbon structure 1 was deposited on the surface 2' either as graphene layer or as graphene layer sequence or as nanotubes or nanowires. The surface 2' thus forms a boundary surface between the carbon structure 1 and the seed structure 2. An incident light beam 19 is generated by means of a light source 18, which can be a semiconductor laser. The incident light beam is reflected on the boundary surface 2'. The outgoing light beam 20 falls into a detector 21. The light source 18 and the detector 21 can be arranged in a process chamber, so that the change of the intensity of the light beam 19, 20, which is reflected on the boundary surface 2', can be measured continuously during the etching process. In the case of an exemplary embodiment, the incident light beam 19 hits the boundary surface 2' at an acute angle >20°. It is also possible, however, that the incident light beam 19 hits the boundary surface 2' vertically to the boundary surface 2'.

FIG. 7 shows the object at the time $t_0$ at the beginning of the etching process.

FIG. 10 shows the course of the change of the reflectivity on the boundary surface 2' during the etching process in a qualitative manner. At the time $t_0$, the incident light beam 19 is reflected on the smooth surface of the seed structure 2, which has a high reflection capacity, so that the reflectivity R, which can be determined via the intensity of the reflected light beam, has a maximum.

Material of the seed structure 2 is removed at the boundary surface 2' during the etching process, so that the boundary surface 2' becomes rougher as the etching process continues. The reflection capacity decreases, so that the detector 21 detects a decreasing intensity/reflectivity. This is illustrated in FIG. 8 at the time $t_1$. The intensity/reflectivity passes a minimum and subsequently increases again, if only partial sections of the substrate surface 3' are still coated with the material of the seed structure 2. The substrate surface 3' has a high reflection capacity, because it is smooth. At the time $t_2$, the intensity/reflectivity reaches a maximum. It does not increase any further. This is a sign that the light beam 19 is only still reflected on the substrate surface 3', which now forms the boundary surface between carbon structure 1 and substrate 3.

If the intensity/reflectivity R reaches the maximum, which follows the minimum, or if it is determined, respectively, that the reflectivity does not increase further, the etching process is ended.

The above statements serve to explain the inventions, which are captured as a whole by the application and which in each case independently further develop the prior art at least by means of the following feature combinations, namely:

A method for separating a carbon structure 1, for example graphene, carbon nanotubes or semiconductor nanowires, deposited on a seed structure 2, from the seed structure 2, consisting of the steps:

provided a carbon structure deposited on a seed structure 2 in a process chamber 7 of a CVD reactors 4;

heating the substrate comprising the seed structure 2 and the carbon structure 1 to a process temperature;

injecting at least one etching gas with the molecular formula $AO_mX_n$, $AO_mX_nY_p$ or $A_mX_n$, wherein A is selected from a group of elements, which includes S, C, N, wherein O is oxygen, wherein X, Y are different halogens and m, n, p are natural numbers greater than zero;

converting the seed structure 2 through a chemical reaction with the etching gas into a gaseous reaction product;

removing the gaseous reaction product from the process chamber 7 by means of a carrier gas flow.

A method, which is characterized in that the seed structure is a metal structure.

A method, which is characterized in that the seed structure includes at least one element from the following group of elements: Cu, Ni, Co, Fe, Ru, Ir, Ga, Gd, Mo, Mn, Ag, Au, B, Si, Ge.

A method, which is characterized in that the seed structure 2 is arranged between a substrate 3 and the carbon structure 1 or above the carbon structure and in the substrate, and is formed by particles, a layer on a substrate 3 or that the seed structure is formed by the substrate itself.

A method, which is characterized in that the etching gas is activated in particular by the supply of heat, by ultraviolet light or by a plasma, wherein provision is in particular made for the activation of the etching gas to take place by heating within the CVD reactor 4, in particular within a gas inlet body 8 therein or within the process chamber 7.

A method, which is characterized in that the etching gas includes the element chlorine and is in particular SoCl2.

A method, which is characterized in that the etching gas is a gas mixture consisting of a plurality of gases, which differ from one another.

A method, which is characterized in that the etching gas is provided in an etching gas source 11, in which in particular a liquid is evaporated.

A method, which is characterized in that an additive gas with the molecular formula RX is injected into the process chamber together with the etching gas, wherein R is hydrogen or a metal and X is a halogen.

A method, which is characterized in that the progress of the conversion of the seed structure 2 into a gaseous reaction product is determined by determining the reflectivity of the surface 2' of the seed structure, wherein a light source 18, which generates an incident light beam 19, which is reflected on the surface 2', and a detector 21, which measures the intensity of the reflected light beam 20, is in particular used to determine the reflectivity, wherein the incident light beam 19 is oriented vertically or at an angle to the surface extension of the surface 2' and/or the light beam is generated continuously or in a pulsed manner.

A method, which is characterized in that the introduction of the etching gas into the process chamber is ended, when the intensity of the outgoing light beam 20 determined by the detector 21 has reached a maximum after passing through a minimum.

A method, which is characterized in that the carbon structure 1 is deposited on the seed structure 2 in the same process chamber 7 prior to separating the carbon structure 1 from the seed structure 2.

A device, which is characterized by a source for providing the etching gas, which in particular has a container 11, in which a liquid is stored, from which the etching gas can be generated by evaporation.

A device, which is characterized by a light source 18 and a detector 21, wherein the light source 18 generates a light beam, which is reflected on a boundary layer between carbon structure 1 and seed structure 2, and which has a detector 21, which determines the intensity of the light beam reflected on the boundary layer.

A device, which is characterized by a control device, which cooperates with the detector 21, and which turns off the admission of the etching gas into the process chamber 7, when the intensity of the reflected light beam 20, which is determined by the detector 21, does not increase further after passing through a minimum.

All disclosed features are significant for the invention (alone, but also in combination with one another). The disclosure content of the corresponding/enclosed priority documents (copy of the prior application) is hereby also included in its entirety into the disclosure of the application, also for the purpose of adding features of these documents into claims of the application at hand. With its features, the subclaims characterize independent inventive further developments of the prior art, in particular to file divisional applications on the basis of these claims.

REFERENCE LIST 1 carbon structure
2 seed structure
2' boundary surface
3 substrate
3' boundary surface
4 CVD reactor
5 susceptor
6 heater
7 process chamber
8 gas inlet body
9 gas exit opening
10 supply line
11 etching gas source
12 supply line
13 inert gas line
14 activation annihilator
15 pump
16 drain
18 light source
19 incident light beam
20 outgoing light beam
21 detector
R reflectivity
$t_0$ time
$t_1$ time
$t_2$ time

What is claimed is:

1. A method, comprising:
within a single process chamber (7) of a chemical vapor deposition (CVD) reactor (4), (i) depositing a carbon structure (1) on a seed structure (2) by providing a carbon containing process gas; and (ii) afterwards separating the seed structure (2) from the carbon structure (1) by:

heating, in the process chamber (7) of the CVD reactor (4), a substrate (3) to a process temperature, wherein the substrate (3), during the heating step, comprises the seed structure (2) and the carbon structure (1) formed on the seed structure (2);

with the carbon structure (1) formed on the seed structure (2), injecting, into the process chamber (7), at least one etching gas with the molecular formula $AO_mX_n$, $AO_mX_nY_p$ or $A_mX_n$, wherein A is selected from a group of elements comprising S, C, and N, wherein O is oxygen, wherein X and Y are different halogens, and wherein m, n, and p are natural numbers greater than zero;

converting the seed structure (2) through a chemical reaction with the at least one etching gas into a gaseous reaction product; and removing the gaseous reaction product from the process chamber (7) by means of a carrier gas flow.

2. The method of claim 1, wherein the seed structure is a metal structure.

3. The method of claim 1, wherein the seed structure includes at least one element from the following group of elements: Cu, Ni, Co, Fe, Ru, Ir, Ga, Gd, Mo, Mn, Ag, Au, B, Si, and Ge.

4. The method of claim 1, wherein the seed structure (2) is disposed between the substrate (3) and the carbon structure (1), is disposed above the carbon structure, is formed by particles, is a layer on a substrate (3) or is formed by the substrate itself.

5. The method of claim 1, wherein the at least one etching gas is activated by heat, by ultraviolet light or by a plasma.

6. The method of claim 5, wherein the etching gas is activated by heating the etching gas within the CVD reactor (4).

7. The method of claim 6, wherein the etching gas is heated within a gas inlet body (8) of the CVD reactor (4) or within the process chamber (7) of the CVD reactor (4).

8. The method of claim 1, wherein the at least one etching gas is $SOCl_2$.

9. The method of claim 1, wherein the at least one etching gas is a gas mixture consisting of a plurality of gases that differ from one another.

10. The method of claim 1, wherein the at least one etching gas is provided in an etching gas source (11), within which a liquid is evaporated.

11. The method of claim 1, further comprising injecting an additive gas with the molecular formula RX into the process chamber together with the at least one etching gas, wherein R is hydrogen or a metal and X is a halogen.

12. The method of claim 1, wherein a progress of the conversion of the seed structure (2) into the gaseous reaction product is determined by determining a reflectivity of a surface (2') of the seed structure, wherein a light source (18), which generates an incident light beam (19) that is reflected on the surface (2') of the seed structure, and a detector (21), which measures an intensity of the reflected light beam (20), are used to determine the reflectivity of the surface (2'), wherein the incident light beam (19) is oriented vertically or at an angle to the surface (2') and/or the light beam is generated continuously or in a pulsed manner.

13. The method of claim 12, wherein the injection of the etching gas into the process chamber terminates when the intensity of the reflected light beam (20), as determined by the detector (21), reaches a maximum after passing through a minimum.

14. The method of claim 1, wherein the carbon structure (1) comprises graphene, carbon nanotubes or semiconductor nanowires.

15. The method of claim 1, wherein the at least one etching gas is activated by ultraviolet light.

* * * * *